United States Patent
Golecki et al.

(10) Patent No.: US 6,458,698 B2
(45) Date of Patent: Oct. 1, 2002

(54) CONTROLLED-STRESS STABLE METALLIZATION FOR ELECTRONIC AND ELECTROMECHANICAL DEVICES

(75) Inventors: Ilan Golecki, Parsippany; Margaret Eagan, Boonton Township, both of NJ (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 09/908,112

(22) Filed: Jul. 17, 2001

Related U.S. Application Data (62) Division of application No. 09/467,728, filed on Dec. 20, 1999, which is a continuation of application No. 09/187,288, filed on Nov. 5, 1998, now Pat. No. 6,173,612.
(60) Provisional application No. 60/139,530, filed on Jun. 16, 1999, and provisional application No. 60/094,473, filed on Jul. 27, 1998.

(51) Int. Cl.$^7$ ............................................. H01L 21/44
(52) U.S. Cl. ........................................ 438/674; 438/680
(58) Field of Search .............................. 438/659, 674, 438/679, 680, 720

(56) References Cited

U.S. PATENT DOCUMENTS 3,661,747 A    5/1972  Byrnes, Jr. et al. ......... 204/192
5,419,822 A    5/1995  Dakesion et al.
5,626,779 A  * 5/1997  Okada

FOREIGN PATENT DOCUMENTS

EP    0762 176 A    3/1997   ........... G02B/26/08
GB    1115055       8/1965   ........... C23C/13/00

OTHER PUBLICATIONS

Kim, J. et al: "Electrothermal Oscillator For Film–Thickness Monitoring", Sensors and Actuators A, CH, Elsevier Sequoia S.A., Lausanne, vol. 66, No. 1–3, Apr. 1, 1998, pp. 56–62, XP004143969.

Boutry, M. et al: "Characterization of Residual Stress In Metallic Films On Silicon With Micromechanical Devices", Proceedings of the SPIE, 1996, XP000905042.

Kuratani, N. et al: "Influences of Intermediate Si–Ni Thin Film Conditions on Adhesion of Ni–TiN Gradient Thick Films", Syposium of the 4$^{th}$ IUMRS International Conference in Asia, Chiba, Japan, Sep. 16–18, 1997, vol. 54, No. 1–3, pp. 313–316, XP000952356.

* cited by examiner

Primary Examiner—David Nelms
Assistant Examiner—Phu T. Dang (57)   ABSTRACT

A method of forming a thin film metallization layer having a predetermined residual stress and a predetermined sheet resistance and force measuring devices formed using the methods.

7 Claims, 4 Drawing Sheets

CONTROLLED-STRESS STABLE METALLIZATION FOR ELECTRONIC AND ELECTROMECHANICAL DEVICES

This application is a divisional of and claims priority from U.S. Ser. No. 09/467,728 filed on Dec. 20, 1999 which claims priority of U.S. Provisional Application Ser. No. 60/139,530, filed in the names of Ilan Golecki and Margaret Eagan on Jun. 16, 1999, the complete disclosures of which are incorporated herein by reference. This application is a Continuation of application Ser. No. 09/187,288, filed on Nov. 5, 1998, which claims priority from U.S. Provisional Application No. 60/094,473, filed on Jul. 27, 1998, the complete disclosures of which are incorporated herein by reference.

FIELD OF THE INVENTION

The present invention relates generally to methods of forming electronic devices, to methods of forming electro-mechanical devices, to methods of forming force-sensing devices, to methods of forming accelerometers, to electronic devices, to electro-mechanical devices, to force-sensing devices, and to accelerometers.

BACKGROUND OF THE INVENTION

Electronic devices and electro-mechanical devices are devices which can include both electrical and mechanical parts. Sometimes, because of the nature of these parts, the way they interact with one another, and the environment within which they are used, the parts can be adversely affected. Exemplary electronic and electro-mechanical devices in the form of force-sensing transducers are described in U.S. Pat. Nos. 5,367,217, 5,339,698, and 5,331,242, the disclosures of which are incorporated by reference. Exemplary accelerometers are described in U.S. Pat. Nos. 5,594,170, 5,501,103, 5,379,639, 5,377,545, 5,456,111, 5,456,110, and 5,005,413, which are incorporated by reference herein. Other types of electronic and electro mechanical devices can be used as rate sensors. Exemplary rate sensors are described in U.S. Pat. Nos. 5,717,140, 5,376,217, 5,696,323, 5,691,472, and 5,668,329, which are incorporated by reference herein. Yet other electronic or electro-mechanical devices can be used as acceleration and rate sensors. Exemplary sensors are described in U.S. Pat. Nos. 5,627,314, 5,557,046, 5,341,682, 5,331,853, 5,331,854, and 5,319,976, the disclosures of which are incorporated by reference herein.

One type of electronic or electro mechanical device is an accelerometer. Accelerometers can have mechanical parts which experience acceleration forces, and electrical parts to help set up conditions conducive to sensing such forces, and to assist in sensing such forces. Yet, these electrical and mechanical parts can sometimes experience problems which adversely impact their performance.

For example, micromachined silicon accelerometers can exhibit undesirable resonator frequency drift at temperatures below 200° C. and even at room temperature. This drift is believed to be due to "creep" or plastic deformation in a current-carrying, evaporated chromium/gold or chromium/molybdenum/gold metallization layer following 400° C. wafer bonding in air. This drift can degrade the performance of a device and can limit its accuracy and its marketability.

The frequency drift can be directly attributed to structural changes which take place in the top, thicker gold layer (typically around 0.2–0.7 micron in thickness). The plastic deformations and creep in the gold layer are due to a low Young's modulus, low hardness and low tensile strength of gold. A much thinner chromium layer (around 100 Angstrom) is used to improve the adhesion of the gold or molybdenum to an underlying thermal silicon dioxide (SiO2) and does not appreciably contribute to the overall resistance or current-carrying capacity. In addition to the above-described creep, gold and chromium, or gold and molybdenum in thin-film form show significant undesirable interdiffusion among themselves in the above temperature range. This can result in an undesirable increased resistivity and visual splotchiness in an otherwise uniform mirror-like appearance of the layers.

Accordingly, there is a need for a more stable metallization, and one which can mitigate some of the problems experienced in electronic or electro-mechanical devices having mechanical and electrical parts. Particularly, there is a need within the context of accelerometers for stable metallization which would mitigate resonator frequency drift, and which would have reduced or no interdiffusion when in contact with chromium or other adhesion-promoting layers. Further, there is a need for materials which exhibit stable resistivity and visual appearance. In addition, an improved metallization scheme should desirably exhibit relatively low electrical sheet resistance, e.g. about 0.25 ohm/square at a total thickness of less than one micron, and good bondability to gold wire. Stress in the metallization should also be desirably as low as possible.

In parent application Ser. No. 09/187,288, the inventors of the present invention described novel metallizations using iridium or rhodium, which are significantly more thermally stable than the above gold or molybdenum/gold metallizations, as the current-carrying conductive material. Each of the iridium and rhodium metallizations was separately and individually deposited on a thin chromium adhesion layer previously deposited on an oxidized silicon wafer substrate. The iridium or rhodium metallizations were deposited using physical vapor deposition in high vacuum. Each of the iridium and rhodium metallizations was shown to possess several desirable characteristics useful for accelerometers, rate sensors and other electronic and electro-mechanical devices, including relatively low and thermally stable sheet resistance for a total metallization thickness smaller than 1 micrometer and no interdiffusion with the underlying chromium adhesion layer after annealing at 400° C. in air. Deposition parameters such as the substrate temperature, metal film thickness and metal deposition rate were varied, and preferred deposition conditions were identified which resulted in the lowest sheet resistance and lowest residual stress.

Although preferred deposition conditions result in the lowest sheet resistance and lowest residual stress, even under optimized deposition conditions, such iridium and rhodium metallization films retained a level of residual tensile stress in the range of about 300 MPa to 1000 MPa at room temperature. This residual tensile stress limits the practical upper thicknesses for such metallization films, and therefore may also limit the lower sheet resistances attainable. High tensile stress in the metallization film in excess of the film's ultimate strength may render the film useless for an intended device through delamination from the substrate or microcracking,. The stress related force on the metallization film increases with film thickness. Residual stresses in thin films may in some cases result in increased rates of failures due to metal fatigue, delamination and microcracking, such effects increasing as a function of increasing film thickness. An improved deposition process which enables the formation of such stable metallization thin films with lower stress, and ideally with much lower stress than 300 MPa, is therefore highly desirable.

The inventors are familiar with efforts to bombard films with ions during deposition. To date, such efforts have been restricted primarily to optical materials rather than current carrying metallization films. The work in ion bombardment of optical materials is not applicable to metallization films. Optical films are typically electrically insulating and optically transparent and usually formed of an oxide, a nitride or a compound which is transparent in the visible or infrared spectrum, rather than a current carrying metal, which is in general optically opaque. Some transparent electrically conductive film materials, such as Indium-Tin-Oxide and Indium-Zinc-Oxide, are known, but these materials are oxides and have electrical conductivities far lower than those of metal films, such as gold, iridium, and rhodium. Furthermore, such ion bombardment in optical materials usually damages electrical conduction properties.

Ion bombardment during deposition in the integrated circuit industry has ignored the current carrying metallization films other than those used in integrated circuits. In particular, the inventors are experts in the field of metallization film deposition and are not aware of efforts to reduce or eliminate stress while retaining or improving electrical conductivity in a metallization film formed of metals, such as iridium, rhodium, tungsten, and osmium, which are not generally used in the integrated circuit industry. In contrast to the prior art, what is needed is a deposition method that significantly reduces or completely eliminates stress in an electrically conductive metallization film while not degrading the film's current carrying capability, and in particular, such deposition method as applied to a group of electrically conductive, refractory and stiff, inert or noble metals, such as iridium, rhodium, osmium, tungsten, and alloys thereof. The deposition process as applied to such electrically conductive and refractory inert or noble metals desirably provides a metallization film having a Young's modulus measured at room temperature greater than the Young's modulus of elemental gold at room temperature. Preferably, the deposition process also retains the metallization film's relatively high electrical conductivity, and provides a metallization film having a coefficient of thermal expansion which is less than that of gold.

SUMMARY OF THE INVENTION

The present invention overcomes the limitations of the prior art by providing novel metallizations using inert or noble metals as the current-carrying conductive material, which are significantly more thermally stable than the above gold or molybdenum/gold metallizations, significantly lower in residual stress, and are highly electrically conductive. According to the invention, the inert metals include a group of electrically conductive inert or noble metals, such as iridium, rhodium, osmium, tungsten, and alloys thereof.

According to one aspect of the present invention, novel and improved thin-film synthesis processes are provided for inert, refractory, highly electrically conducting thin films resulting in thin metallization films having much lower tensile stress than 300 MPa.

According to another aspect of the present invention, a novel and improved thin film deposition process is provided that enables practical control during deposition of both the sign and the magnitude of the stress in such thin films. In other words, the invention provides an improved thin-film synthesis process whereby thin metal films are deposited, the deposited thin films possessing intentionally either compressive or tensile residual stress, including zero or near-zero residual stress. Additionally, the processes for depositing reduced-stress thin films do not result in significant degradation of any other key film properties, such as sheet resistance, adhesion to the substrate or to the chromium or other adhesion layer and visual appearance.

According to other aspects of the invention, the invention provides a novel and improved thin film synthesis method applicable to many deposition materials, in addition to iridium, rhodium, osmium, tungsten, and alloys thereof, where iridium and rhodium are used merely as non-limiting reduction-to-practice examples.

According to various aspects of the invention, the present invention provides the bombarding of metal films with energetic particles of an inert gas, having energies in the range 10–2000 electron-volt, simultaneously with the metal deposition process inside a high-vacuum chamber. Such energetic particles include any of ions or energetic neutral atoms or molecules of an inert gas, having energies in the range 10–2000 electron-volt. Thus, during deposition of the metal film, the growing metal film is exposed to a stream of any of energetic neutral atoms or molecules of an inert gas or either positively or negatively charged ions, for example Ar+ ions.

According to still other aspects of the present invention, the invention provides a method of metal deposition wherein through control of various factors, including the ion type, ion voltage or energy, ion current density, metal deposition rate and substrate temperature, metal films are obtained having a desired predetermined residual stress, in the ranges of high tensile through low tensile to zero and reversing sign to low compressive through high compressive. Control of the above factors further provides metal films having sheet resistance sufficiently low for use in practical electronic and sensor device applications. Additionally, control of the above factors further provides metal films having desirable predetermined combinations of residual stress and sheet resistance, including a combination of essentially zero residual stress and sheet resistance usefully low for practical electronic and sensor device applications.

According to yet other aspects of the present invention, the invention provides a method of metal deposition wherein control of the above factors results in low and zero-stress films deposited much thicker than previously possible in the art, without such films microcracking or delaminating from the substrate.

According to yet other aspects of the present invention, the invention provides a method of obtaining metal films having a desirable predetermined combination of essentially zero residual stress and usefully low sheet resistance wherein the inert gas ions used for bombardment during metal deposition do not predominantly remain in the metal film and thus do not act as an electrically active impurity.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is methods for forming thin metallization films on substrates, the metallization films having minimal or near zero residual stresses and usably low sheet resistances, and measurement instruments formed of such methods.

Figure 1:
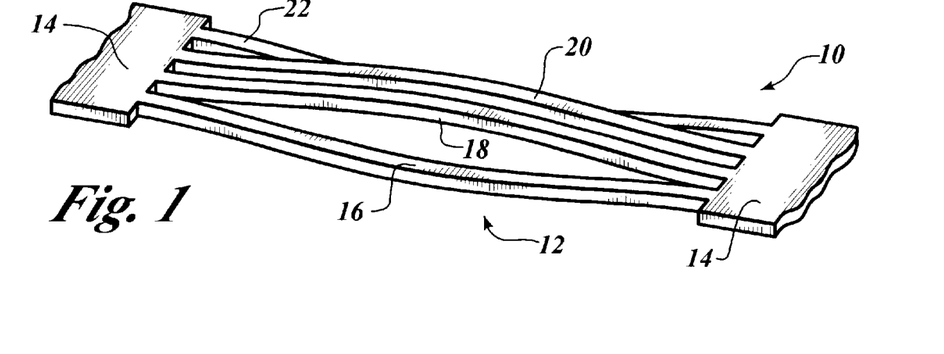
FIG. 1 is a perspective view of an electronic or electro-mechanical device which can be utilized in connection with one or more embodiments of the invention.
Figure 2:
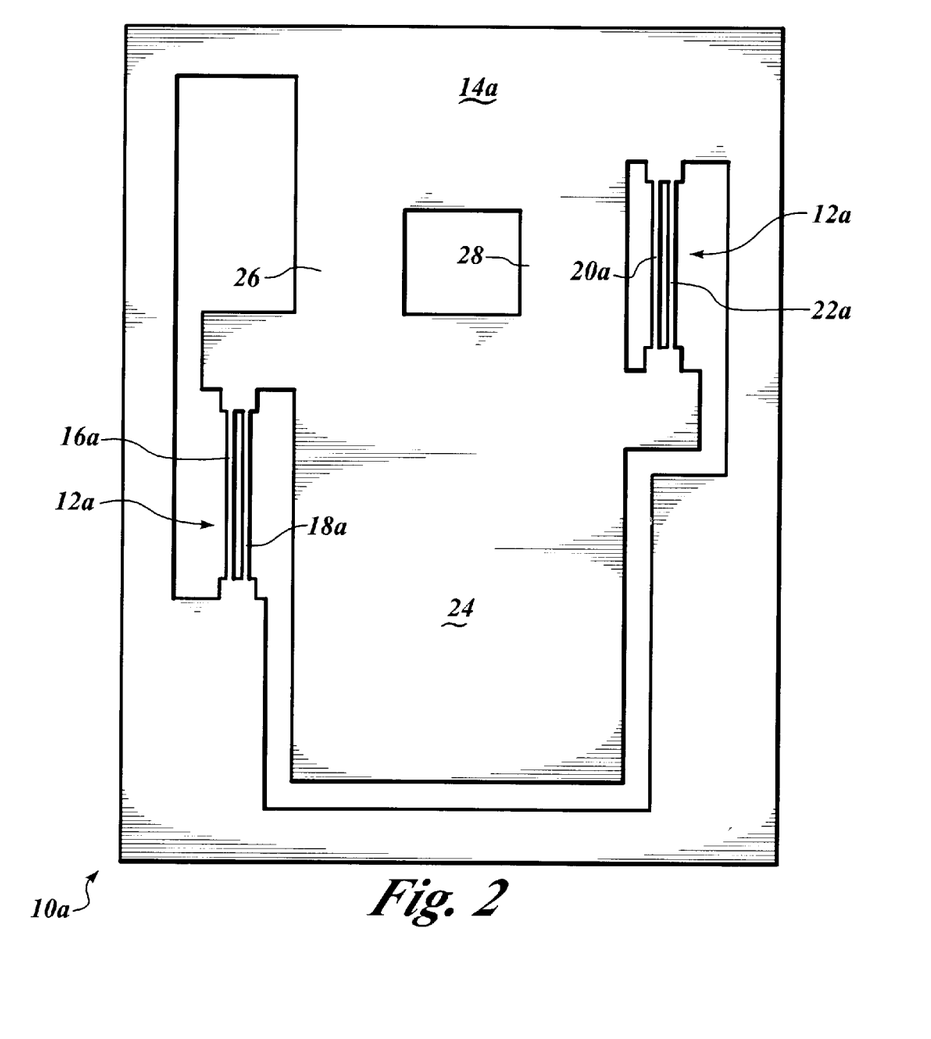
FIG. 2 is a top plan view of another electronic or electro-mechanical device which can be utilized in connection with one or more embodiments of the present invention.

FIGS. 1 and 2 show exemplary electronic or electro-mechanical devices generally at 10 and 10a respectively. Devices 10 and 10a comprise respective structures having movable portions 12, 12a, and support portions 14, 14a connected therewith. In the illustrated example, the structures' movable and support portions are formed from a crystalline material, e.g. a silicon-containing material such as monocrystalline silicon. In a preferred embodiment, the structures are provided by etching the movable and support portions from the crystalline material in a known manner. Such is described in more detail in some of the references incorporated above. Other electronic or electro-mechanical devices can, of course, be provided by the embodiments of the invention described below. These devices need not, however, necessarily be formed from a crystalline material such as the monocrystalline silicon mentioned above.

In one embodiment, devices 10, 10a comprise force-sensing transducers or devices including respective force-sensing substrates 14, 14a, having respective force-sensing elements 12, 12a. The force-sensing substrates and elements are preferably provided by etching a crystalline material, e.g. monocrystalline silicon. In one embodiment, force-sensing elements 12, 12a comprise vibratable force-sensing elements. In a preferred embodiment, pairs of vibratable beams 16, 18 and 20, 22 (FIG. 1) and 16a, 18a, and 20a, 22a (FIG. 2) are etched from the crystalline material. The specific illustrated embodiments can, of course, have more or less vibratable beams.

FIG. 2 shows an electronic or electro-mechanical device in the form of an accelerometer. The accelerometer is preferably formed from a single wafer of silicon through micro-machining techniques. Accelerometers such as this and others are described in U.S. Pat. No. 5,005,413 which is incorporated by reference above.

Accelerometer 10a is configured as a force-sensing transducer which senses an acceleration force which acts upon the accelerometer. In this example, substrate 14a includes a proof mass 24 and a vibratable assembly 12a connected or joined therewith and configured to detect an acceleration force. Proof mass 24 is supported by a pair of flexures 26, 28. In this example, device 10a comprises a vibrating beam accelerometer whose vibratable assembly 12a comprises a plurality of vibratable beams 16a, 18a, and 20a, 22a. The beams are arranged, together with proof mass 24, in a configuration which develops different vibratory frequencies responsive to movement or deflection of proof mass 24 in accordance with an acceleration applied thereto. The various frequencies at which the beams vibrate give an indication of the acceleration force acting upon the proof mass. The acceleration-sensing operation of this device is described in U.S. Pat. No. 5,379,639, incorporated by reference above.

Briefly, vibratable assembly 12a is configured into a push-pull configuration such that when proof mass 24 experiences an acceleration, it is moved or deflected along an input axis either into or out of the plane of the page upon which FIG. 2 appears. Such movement or deflection causes one of the pairs of beams 16a, 18a or 20a, 22a to go into tension and the other of the pairs of beams to go into compression. As this compression and tension occurs, the respective frequencies at which the beams vibrate change in a known and measurable manner.

Figure 3:
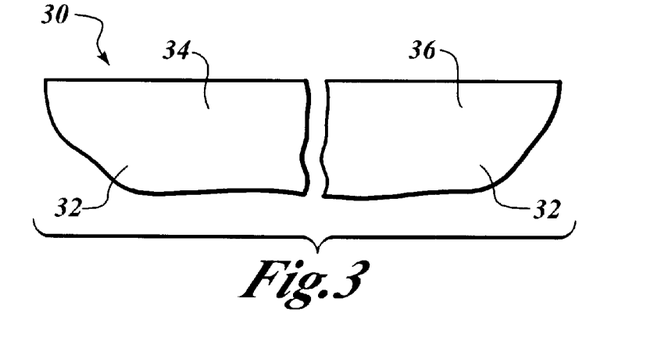
FIG. 3 is a diagrammatic side sectional view of a substrate, in process, in accordance with one or more embodiments of the present invention.

FIG. 3 shows a substrate at 30. Substrate 30 preferably comprises a substrate which forms a portion of an electronic or electro-mechanical device. The device can comprise one such as those described above in FIGS. 1 and 2, or other types of devices.

In one embodiment, substrate 30 comprises a crystalline material 32. Exemplary crystalline materials include various silicon-containing materials such as the monocrystalline silicon substrates mentioned above. The structure provided by substrate 30, in a preferred embodiment, includes a movable portion 34 and a support portion 36 connected or joined therewith. In some embodiments, particularly those comprising silicon transducers, accelerometers, and rate sensors, a thin thermal silicon dioxide layer can be formed or provided over the substrate prior to formation of the electrically conductive material described just below. Exemplary devices are described in the references incorporated above.

Figure 4:
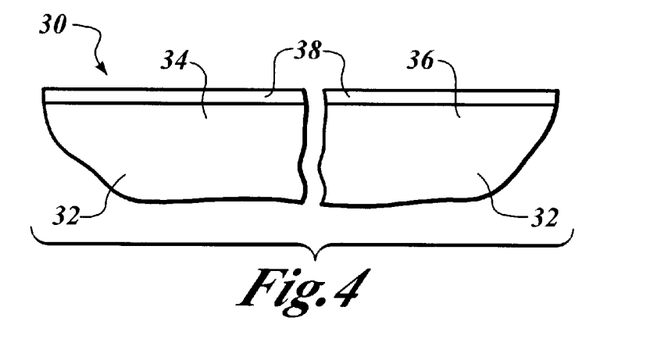
FIG. 4 is a view of the FIG. 3 substrate at a processing step which is subsequent to that which is shown in FIG. 3.

FIG. 4 shows, in accordance with one embodiment, an electrically conductive material layer 38 which is formed over the structure and positioned to carry electrical current. Layer 38 is preferably formed over at least some of movable portion 34 and some of support portion 36. In one preferred embodiment, layer 38 comprises an inert material having a Young's modulus at room temperature which is greater than that of elemental gold at room temperature. In the context of this document, "inert" will be understood to mean relatively unreactive chemically.

Layer 38 can be formed over the substrate in any suitable manner. In one preferred embodiment, layer 38 is formed by physically vapor depositing the layer over substrate 30. Exemplary conditions through which such physical vapor deposition can take place are described below. In a preferred embodiment, layer 38 comprises one of iridium or rhodium which are physically vapor deposited over substrate 30.

In another embodiment, layer 38 comprises a layer which is formed over a force-sensing element, such as those described above, and which comprises an inert or noble metal selected from a group of noble metals each of which having a Young's modulus at room temperature greater than the Young's modulus of elemental gold at room temperature. In the context of this document, "noble metals" will be understood to include metals or alloys which are relatively unreactive chemically and have a relatively high resistance to corrosion and oxidation, as compared with "base" metals such as iron and copper.

In one embodiment, the noble metal has a Young's modulus greater than about 300 GPa. In another embodiment, the noble metal has a coefficient of thermal expansion at room temperature less than about 13 ppm/° C. In another embodiment, the noble metal is formed by physically vapor depositing the metal over substrate 30 to provide layer 38. Exemplary materials for the noble metal comprise iridium, rhodium, osmium, tungsten, or alloys thereof.

In another embodiment, layer 38 comprises an electrically conductive material which is formed over a force-sensing element, such as those described above, and which has a Young's modulus greater than about 350 GPa. In this example, layer 38 preferably comprises a metal or a metal alloy which is formed over the force-sensing element. Exemplary metal alloys include, but are not limited to, Au-Ni (gold-nickel), and Au-Cu (gold-copper). In another embodiment, layer 38 comprises a silicide which is formed over a force-sensing element. Exemplary silicides include, but are not limited to, titanium disilicide (TiSi2) and cobalt disilicide (CoSi2). In another embodiment, layer 38 comprises a carbide which is formed over a force-sensing element. Exemplary carbides include, but are not limited to, titanium carbide (TiC) and tantalum carbide (TaC). In another embodiment, layer 38 comprises a nitride which is formed over a force-sensing element. Exemplary nitrides include, but are not limited to, titanium nitride (TiN) and zirconium nitride (ZrN).

In yet another embodiment, layer 38 comprises an inert or noble material which is formed over a force-sensing element. In a preferred embodiment, the inert material has a coefficient of thermal expansion which is less than that of gold.

Many of the above materials can be deposited as thin films using physical vapor deposition or other evaporation techniques which are known. Of course, other methods can be used, e.g. sputtering, molecular beam epitaxy, chemical vapor deposition and laser ablation.

In another embodiment, layer 38 comprises an electrically conductive path which is disposed over a vibratable assembly, such as those described above in connection with FIGS. 1 and 2, and the vibratable assembly is configured to detect an acceleration force. In one preferred embodiment, the electrically conductive path comprises a noble metal having a Young's modulus at room temperature which is greater than that of elemental gold at room temperature. In another embodiment, the Young's modulus is greater than about 300 GPa. In yet another embodiment, the noble metal has a coefficient of thermal expansion less than about 13 ppm/° C.

In still another embodiment, layer 38 comprises an electrically conductive path which is disposed over a vibratable assembly and comprises an inert or noble material having a coefficient of thermal expansion less than that of elemental gold.

In various embodiments of the present invention described above and below, a gold layer or gold-molybdenum bi-layer, previously utilized in connection with micromachined silicon accelerometers, is replaced by a single layer of higher-modulus (higher than gold), relatively low-resistivity, electrically conductive material, e.g. a noble metal. Exemplary metals include iridium, rhodium, osmium, and tungsten. Preferred materials are iridium and rhodium.

A comparison of the relevant published properties of the bulk materials, at room temperature, is provided in the table immediately below.

| Metal | Resistivity (micro-ohm · cm) | Young's Modulus (GPa) | Tensile Strength (MPa) | Thermal Expansion Coefficient (ppm/° C.) |
|---|---|---|---|---|
| Au | 2.2 | 78 | 130–220 | 14.1 |
| Mo | 5.7 | 325 | 485–690 | 5.7 |
| Ir | 5.1 | 528 | 550–1200 | 7.9 |
| Rh | 4.7 | 379 | 690–2070 | 10.3 |
| Os | 8.8 | 559 | | 4.6 |
| W | 5.4 | 411 | 550–1920 | 4.5 |

Note that the values for thin films of the same materials can differ from the bulk values, depending on the fabrication methods used. As is apparent from the table, iridium, rhodium, osmium, and tungsten are much stiffer than gold, and have a much higher tensile strength. Accordingly, such materials can be used to reduce creep or other structural changes that are expected with time at temperatures below 400° C.

The electrical resistivities of these metals are in an acceptable range, and are, with the exception of osmium, lower than that of molybdenum. Additionally, because metals such as iridium and rhodium are inert, whereas molybdenum is reactive with oxygen and other environmental impurities, the actually-measured resistivities of iridium and rhodium can be expected to be and are in fact much closer to the published values than is the case with molybdenum, the measured resistivity of which is much higher than the published value.

The coefficients of thermal expansion (CTE) of these metals are also much closer to that of silicon (3.9 ppm/° C. at 400° C.) than the CTE of gold. The adhesion of iridium and rhodium to SiO2 (via a thin chromium layer, or, even in the absence of chromium) is very good and both metals can be bonded to gold wires. Sheet resistances below 0.25 ohm/square can be obtained with total metallization thicknesses of less than one micron. No measurable interdiffusion between iridium and chromium and between rhodium and chromium has been found in the above temperature range (below 400° C.).

Further, the appearance of the thin films is mirror smooth and shiny when proper fabrication conditions are employed. Process conditions in the deposition of iridium and rhodium have been developed which meet or exceed all the requirements for a metallization described above, and preferred process parameters have been identified to obtain films with desirable properties.

In a reduction-to-practice example, either iridium or rhodium were deposited on thermally oxidized (about 5000 Angstrom oxide thickness), round, 4-inch diameter, <100> oriented, silicon-crystalline wafer substrates, using physical vapor deposition. Other thin film deposition methods known to those skilled in the art can be utilized, for example, sputtering, molecular beam epitaxy, and chemical vapor deposition.

The same or similar methods are also applicable in connection with other substrate materials, for example group III–V compounds, SiC, oxides and ceramics, substrates with other crystalline orientations, e.g. <111>, or polycrystalline or amorphous substrates, and other wafer sizes and shapes.

A chromium adhesion layer and an upper current-carrying, higher-modulus layer (e.g. iridium or rhodium) were deposited sequentially on thermally oxidized silicon single-crystalline wafers by physical evaporation in a vacuum chamber. Prior to film deposition, each wafer's curvature was measured for reference purposes, and each wafer was cleaned using techniques known to those of skill in the art. For example, wafers were degreased in organic solvents, such as methylene chloride, rinsed in acetone then isopropanol or ethanol, and in deionized water. The wafers can be placed in an ultrasonically-agitated bath during cleaning. The wafers can also be cleaned in a mixture of sulfuric acid and hydrogen peroxide, then rinsed in deionized water and dried at 100° C. The wafers can also be cleaned in an ozone plasma. Other established wafer cleaning techniques can be used.

The wafers were loaded in a physical evaporation system comprising a water-cooled vacuum chamber enclosing several metal sources which can be individually heated and melted by means of an electron beam. An exemplary system is commonly known as E-gun evaporation. Other metal heating and melting configurations can be used, for example, by means of a resistive filament. The system can be controlled manually or programmed for automatic operation. The chamber is pumped to a base pressure in the range of 1×10−7 to 1×10−6 Torr using a liquid-nitrogen-trapped, oil-filled, high-vacuum diffusion pump backed by an oil-lubricated rotary mechanical forepump. Other pumps can be used, for example, turbo-molecular and cryogenic pumps for the high-vacuum pumping backed by means of a diaphragm and claw-type oil-free rotary forepumps. The chamber was purged one or more times with argon or other inert gas (e.g. nitrogen) after initial pumpdown in order to reduce the partial pressure of water vapor, oxygen and other undesirable, especially oxidizing impurities in the air.

The wafers, which are the substrates for the metal thin films, can be heated prior to and during deposition by means of quartz halogen lamps located within the chamber. Other means of heating can also be used, for example, resistive heating of the support plates on which the wafers are positioned. The wafers are preferably positioned on an axially rotating planetary fixture and each wafer is additionally made to rotate around its own axis. The two rotations result in improved uniformity of thickness and temperature across the surface of each wafer. The temperature of the wafers is measured by means of a thermocouple positioned inside the chamber in close proximity to the surfaces of the wafers, which enables setting and controlling the temperatures of said wafers. The actual temperatures of the wafers in relation to that of said thermocouple can be measured using several techniques, e.g. by means of thermocouples attached directly to test wafers, by means of thermal dots applied to a surface of the wafers, and the like. The actual substrate temperatures can thus be determined within +/−25° C. of the thermocouple temperature.

The metal thin films are deposited by heating each metal source using the electron gun, such that a molten pool of metal is formed within the metal source; part or all of the metal source may be melted in this fashion. The metal source may be initially placed directly in a water-cooled copper hearth or in a liner material, the latter being placed inside the copper hearth. Such practice is known in the art. If a liner material, such as graphite, is used, it is important to prevent dissolution and or mixing of the liner material with the molten pool of metal. Such mixing may result in carbon contamination in the deposited films, which may undesirably increase their sheet resistance. The heating and melting of such a metal source will result in evaporation of metal atoms and larger microscopic entities inside the chamber and will form a deposited coating on the surface of the wafers which are facing the metal source. The deposition rate and the total thickness of such a layer are measured and controlled by means of a quartz crystal monitor, which is known in the art. Thus, the principle deposition parameters for every layer are the temperature of the substrates (Ts), the desposition rate (r, in Angstrom/second) and the total thickness (t, in Angstrom). These parameters are controlled in the physical evaporation system and they have an influence on the relevant physical properties of the deposited layers. Such properties include the sheet resistance (Rsh), stress, microstructure and impurity concentration. The values of such properties, as well as the thicknesses of the deposited films are measured after deposition by techniques known in the art.

Experiments designed to identify deposition parameters, as indicated above, which result in metallizations possessing desirable properties have been carried out. Examples of the results from such experiments for chromium/iridium are given in the table below. The chromium thickness was 100 A and chromium deposition rate was 2 A/s in these cases. Film stress was tensile in all cases (concave substrate curvature after film deposition on metallized side of the substrate).

| $t_{Ir}$ (A) | $r_{Ir}$ (A/s) | Ts (° C.) | $R_{sh}$ (ohm/square) | Film Stress (MPa) | Notes |
|---|---|---|---|---|---|
| 3000 | 1 | 390 | 0.30 | 2120 | |
| 4500 | 1 | 410 | 0.20 | 1550 | |
| 4500 | 1 | 350 | 0.20 | 1270 | |
| 4500 | 1.2 | 350* | 0.17 | 372 | |
| 4500 | 1.2 | 350* | 0.18 | 316 | |
| 5200 | 1.5 | 350 | 0.16 | 2120 | Delaminated later |
| 5200 | 4 | 350 | 0.34 | 2010 | Microcracked; delaminated later |
| 5200 | 1.5 | Room Temperature | 0.43 | 1260 | |
| 6000 | 4–6 | 350 | 0.26 | 2460 | Microcracked |
| 9000 | 1.5 | 300 | 0.24 | 1220 | Microcracked |

In the above table, it is seen that the best results (lowest sheet resistance and lowest stress) were obtained when the iridium film thickness was 4500 A, the iridium deposition rate was around 1A/s and the substrate temperature was 350° C. The metal thin film depositions marked with an asterisk (*) were done with the substrate holders closer to the heating lamps, even though the temperature indicating thermocouple was positioned at approximately the same location as in the other runs and it indicated the same 350° C.; the actual substrate temperature in the runs noted with the asterisk is believed to have been about 350° C., as the thermocouple indicated, whereas in the other runs, the actual substrate temperature was somewhat lower than the thermocouple reading. Another observation is that even though several of these film stresses, calculated from the substrate curvatures before and after metallization, exceeded the nominal, published tensile strength for bulk iridium, several such films deposited under these specific conditions did not microcrack or delaminate, signifying that the actual tensile strength of such films was higher than the published bulk values. Chromium/iridium films of 3000 and 4500 A iridium thickness as described above have been successfully bonded to gold wires. Device wafers metallized with chromium/iridium layers deposited using the above-described apparatus and under similar conditions as in the runs marked with the asterisk (*) have been successfully fabricated. The frequency stability was measured and found to be improved at least ten times (i.e. frequency drift was at least ten times less) than obtained in devices metallized with the previously used chromium/gold or chromium/molybdenum/gold metallization.

Experiments designed to identify deposition parameters, as indicated above, which result in chromium/rhodium metallizations possessing desirable properties have been carried out similarly to what has been described for chromium/iridium. Examples of the results from such experiments for chromium/rhodium are given in the table below. The chromium deposition rate was 2 A/s in these cases. Film stress was tensile in all cases (concave substrate curvature after film deposition on metallized side of the substrate).

| $t_{cr}$ (A) | $t_{Rh}$ (A) | $r_{Rh}$ (A/s) | $T_s$ (° C.) | $R_{sh}$ (oh/square) | Film Stress (MPa) |
| --- | --- | --- | --- | --- | --- |
| 230 | 3000 | 1.2 | 350 | 0.25 | 820 |
| 94 | 4500 | 1.2 | 350 | 0.16 | 750 |
| 94 | 6000 | 1.2 | 350 | 0.11 | 700 |
| 94 | 9000 | 2.3 | 350 | 0.071 | 780 |
| 185 | 6000 | 1.2 | 295 | 0.10 | 560 |
| 230 | 6000 | 1.2 | 270 | 0.11 | 410 |
| 185 | 6000 | 1.2 | 240 | 0.13 | 450 |
| 230 | 6000 | 1.2 | 220 | 0.12 | 550 |
| 230 | 6000 | 1.2 | 195 | 0.14 | 950 |
| 230 | 6000 | 1.2 | 165 | 0.17 | 1290 |
| 94 | 6000 | 1.2 | Room Temperature, 130 | 0.34 | 840 |
| 94 | 6000 | 2.3 | 350 | 0.11 | 760 |
| 94 | 6000 | 4.6 | 350 | 0.11 | 730 |
| 94 | 6000 | 9.2 | 350 | 0.11 | 780 |
| 230 | 6000 | 4.6 | 270 | 0.12 | 460 |
| 230 | 6000 | 9.2 | 270 | 0.13 | 440 |

From these results several conclusions can be drawn. At nominally identical thicknesses (e.g. 4500 A), and for films which did not microcrack or delaminate, the sheet resistance obtained with chromium/rhodium is slightly lower than that obtained with chromium/iridium. Thus chromium/rhodium would be preferred under these conditions.

The process window for depositing chromium/rhodium films is much larger than for chromium/iridium in terms of the thickness range of the iridium or rhodium which results in stable, non-delaminating and non-microcracking films, as well as in terms of the substrate temperature and rhodium or iridium deposition rate.

Metallizations with acceptable properties can be obtained at very high rhodium deposition rates, e.g. as high as 9.2 A/s, with little or no effect on sheet resistance and stress.

The lowest sheet resistances are obtained at substrate temperatures at or above 220° C., and, in this temperature range the sheet resistance is relatively insensitive to temperature, all other conditions being equal. At temperatures below 165° C., the sheet is much more sensitive to substrate temperature.

Films with the lowest stress are obtained in the substrate temperature range of approximately 240–270° C., all other conditions being equal. Below approximately 220° C., the stress becomes higher and is very sensitive to substrate temperature. The stress also increases with temperature above 270° C.

The invention has been described in compliance with the applicable statutes. Variations and modifications will be readily apparent to those of skill in the art. It is therefore to be understood that the invention is not limited to the specific features shown and described, since the disclosure comprises preferred forms of putting the invention into effect. The invention is, therefore, to be interpreted in light of the appended claims appropriately interpreted in accordance with the doctrine of equivalents.

Alternative Embodiments

Alternative embodiments of the invention provide a method of bombarding the metallization films with particles of an inert gas having high kinetic energy. According to alternative embodiments of the invention, metallization films, for example iridium, rhodium, tungsten, or osmium, are bombarded with energetic particles of an inert gas, such as argon (Ar) or krypton (Kr), inside the high-vacuum chamber simultaneously with the metal deposition process. In other words, while the metal film is being deposited by physical vapor deposition or another process, this growing metal film is also exposed to an energetic stream of positively or negatively charged ions or uncharged neutral atoms or molecules of an inert gas. Using the method of the present invention, metal films are obtained having a desirable predetermined combination of predetermined levels of residual stress and sheet resistance wherein the inert gas particles used for bombardment during metal deposition do not predominantly remain in the metal film and thus do not act as an electrically active impurity.

Figure 5:
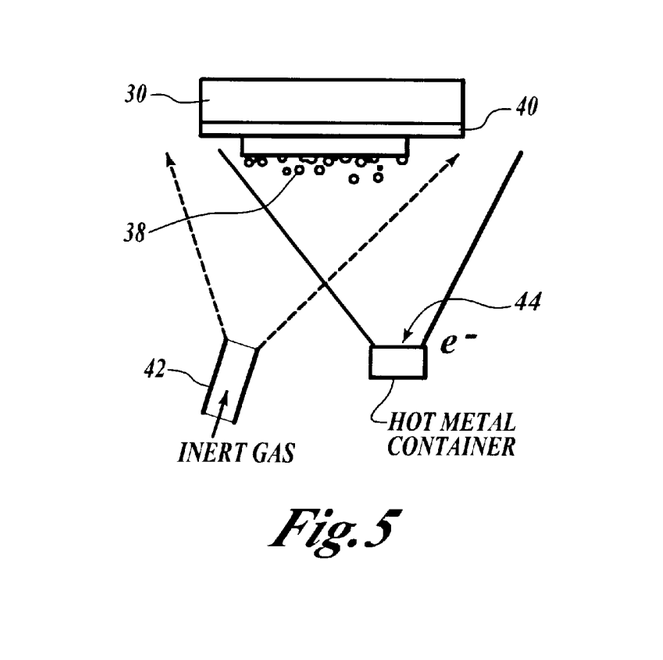
FIG. 5 is a schematic illustration of the ion beam enhanced deposition of a metal thin film.

FIG. 5 schematically illustrates the ion bombardment method of the alternative embodiments of the invention. In reduction-to-practice examples of alternative embodiments of the invention, each of iridium or rhodium films 38 were deposited on thermally oxidized (about 5000 Angstrom oxide thickness), round, 4 inch diameter,<100> oriented silicon single-crystalline wafer substrates 30, using physical vapor deposition. Other thin-film deposition methods known to those skilled in the art can also be utilized with the alternative embodiments, for example sputtering, molecular beam epitaxy, laser ablation and high-vacuum chemical vapor deposition. The same or similar methods are also applicable to other substrate materials, for example III–V compounds, SiC, oxides and ceramics; substrates in other crystalline orientations, e.g.<111>, or polycrystalline or amorphous substrates, and other wafer sizes and shapes.

A chromium adhesion layer 40 and an upper current-carrying, higher-modulus layer (e.g. iridium or rhodium) 38 were deposited sequentially on thermally oxidized silicon single-crystalline wafers by physical evaporation in a vacuum chamber. Again, prior to film deposition, the curvature of each wafer was measured for reference purposes, and each wafer was cleaned using established wafer cleaning techniques known to those of skill in the art and described above.

The cleaned wafers were again loaded in a physical evaporation system comprising a water-cooled vacuum chamber enclosing several individually heated and melted metal sources. This evaporation chamber includes a Kaufmann-type ion source 42 designed to produce a relatively spatially-broad beam of ions having energies in the range 50 to 1500 eV and currents up to about 120 milli-amps as measured at the source. The ion beam precursor material is a gas of, for example, helium, neon, argon, krypton, xenon, nitrogen, or another suitable ion beam precursor material. Preferably, the ion current density near the substrate location is measured using a so-called Faraday probe connected to a current meter via an electrical vacuum feedthrough. The chamber was pumped to a base pressure in the range of $1\times10^{-7}$ to $1\times10^{-6}$ Torr. After initial pumpdown, the chamber was purged one or more times with inert gas, such as argon or nitrogen to reduce the partial pressure of water vapor, oxygen and other undesirable, especially oxidizing impurities normally present in air.

The wafers, which are the substrates 30 for the metal thin films, were heated prior to and during deposition by suitable heat sources located within the chamber. The wafers were again preferably positioned on an axially rotating planetary fixture and each wafer is additionally made to rotate around its own axis. The planetary rotation rate was in the range 2–12 revolutions per minute. The two rotations result in improved thickness and temperature uniformity across the surface of each wafer. These multiple rotations also result in improved uniformity of the ion beam current density across each wafer. The temperature of the wafers was determined by means of a thermocouple positioned inside the chamber in close proximity to the wafers. The wafer temperature was determined to be within +/−25° C. of the thermocouple temperature.

The metal thin films 38 are again deposited by heating each metal source 44 using conventional methods well known in the art and described above, such that a molten pool of metal is formed within the metal source. The heating and melting of such a metal source results in evaporation of metal atoms and larger microscopic entities inside the chamber which form a deposited coating on the surface of the wafers facing the metal source. The deposition rate and the total thickness of such a layer 38 are measured and controlled by means known in the art, such as a quartz crystal monitor.

During deposition of the metal film, deposition layer 38 is simultaneously bombarded with energetic particles of an inert gas, such as argon (Ar) or krypton (Kr) or another inert gas having energies in the range 10–2000 eV (electron-volt) per atom. In other words, while the metallization film is being deposited, the growing metal film is exposed to a stream of positively or negatively charged ions or neutral atoms or molecules, for example Ar+ ions, having an energy preferably in the range 160–300 eV. The ion source is supplied with a constant flow rate of an inert gas, such as argon or krypton. The flow rate is measured and controlled manually, for example, using a needle valve. Alternatively, the flow rate is measured and controlled electronically, for example, using a mass flow controller. Flow rates are preferably in the range 1–20 sccm (standard cubic centimeter per minute). The pressure in the chamber, which increases with increasing flow rate, is measured, for example, using an ionization gauge, and is conveniently held below approximately $1\times10^{-3}$ Torr, and more preferably below approximately $5\times10^{-4}$ Torr, during ion bombardment. Different evaporation chambers, having different sizes and pumps, may require adjustments to the above values. Such adjustments are believed to be well within the ability of one of ordinary skill in the art to determine without undue experimentation. The ion source is preferably controlled by an electronic power supply which starts the gaseous discharge, ensures that the discharge is stable, and ensures that the desired voltage and current parameters are obtained and maintained. Any of various types of power supplies are used for that purpose. The inert gas flow rate is adjusted to obtain a relatively stable discharge with desirably low discharge current, other considerations apart. Again, such adjustments are believed to be well within the ability of one of ordinary skill in the art to determine without undue experimentation.

Thus, the principal deposition parameters for every layer are: the temperature of the substrates ($T_s$), the metal deposition rate (r, in Angstroms/second), the total metal film thickness (t, in Angstroms), the ion voltage (V, in Volts) or equivalent energy (E, in eV) and the ion current (I, in milli-Amps). The actual ion current density at the substrates depends on the ion source parameters and the distance between the ion source and the substrates. For a given geometry in a given deposition chamber, the arrival ratio of metal atoms to inert gas ions, R=M/I, is another relevant parameter, which is however, included in the previously listed parameters. The above parameters are controlled in the physical evaporation system and influence the relevant physical properties of the deposited layers. Such properties include the sheet resistance ($R_{sh}$), stress, microstructure and impurity concentration. The values of such properties, as well as the thickness of the deposited films are measured after deposition by techniques well known to those of ordinary skill in the art.

The invention has been practiced, at least to the extent of performing experiments designed to identify deposition parameters, as indicated above, which result in metallizations possessing desirable properties, and, in particular, a controlled and preferably near-zero value of residual stress. The results of such experiments are detailed below and in the accompanying FIGS. 6–9.

Figure 6:
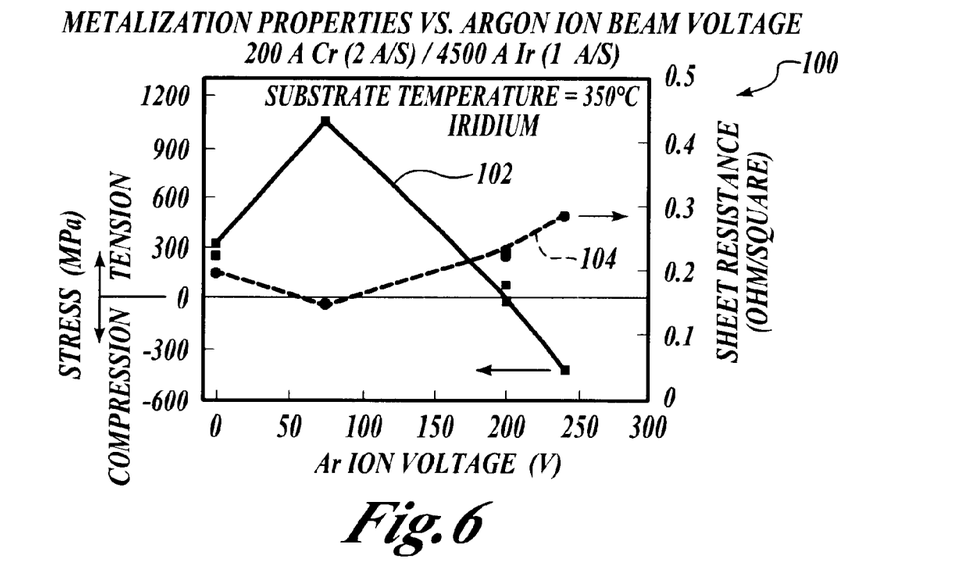
FIG. 6 is a graphical illustration of residual stress and sheet resistance of chromium/iridium films, measured at room temperature, versus argon ion voltage, at constant argon ion current of 100 milli-amps, in ion beam enhanced metal deposition.
Figure 7:
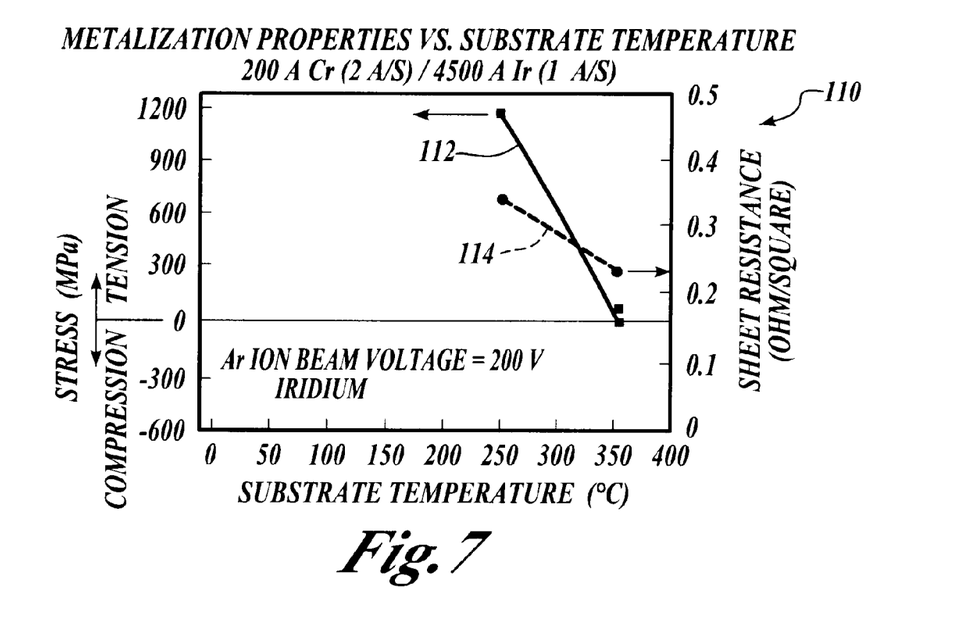
FIG. 7 is a graphical illustration of residual stress and sheet resistance of chromium/iridium films versus substrate temperature, at constant argon ion voltage of 200 V and argon ion current of 100 milli-amps, in ion beam enhanced metal deposition.

FIGS. 6 and 7 graphically show the results from such experiments for chromium/iridium. FIG. 6 shows a graph 100 that details the residual stress and sheet resistance of chromium/iridium films, measured at room temperature, versus argon ion voltage, at constant argon ion current, in ion beam enhanced metal deposition. In this set of experiments, the thickness and deposition rate of chromium adhesion layer 40 were held constant at 200 Angstroms and at 2 Angstroms/second, respectively. The thickness of iridium metallization layer 38 was also held constant at 4500 Angstroms, deposited at a rate of 1 Angstroms/second, while the temperature of substrate 30 was held constant at 350° C. The argon ion beam current was held at 100 milli-amps. The graph 102 of residual stress versus argon ion beam voltage clearly shows that as voltage increases from 0 to 250 V (corresponding to Ar+ ion energy of 0 to 250 eV), the residual stress in the iridium film starts out as tensile and first increases with increasing ion energy. At about 75 V, the residual stress in the iridium film reaches a maximum tensile stress and, from that maximum, decreases with continued increasing ion energy, crossing the zero stress level at 200 V. Residual stress becomes compressive with further increases in voltage, and at 250 V the residual stress is clearly highly compressive. Thus both the sign and the magnitude of the residual stress are controlled by means of the voltage or energy of the argon ion beam, all other parameters being constant. As shown in graph 104, the sheet resistance of the iridium films follows a different and controllable dependence upon ion beam voltage. The sheet resistance is a minimum at about 75 V ion beam voltage, and increases with increasing ion beam energy. At 200 V ion beam voltage the sheet resistance is about 0.24 ohm/square, which is a very usable value in a practical device.

FIG. 7 shows a graph 110 that depicts the dependence of the film stress and sheet resistance on the temperature of substrate 30 during deposition of iridium metallization layer 38 over chromium adhesion layer 40, with concurrent argon ion bombardment. The thickness of chromium adhesion layer 40 on substrate 30 is 200 Angstroms deposited at about 2 Angstroms/second, while the thickness of iridium metallization layer 38 is 4500 Angstroms, deposited at about 1 Angstroms/seconds. Graph 110 illustrates residual stress and sheet resistance of chromium/iridium films versus substrate temperature, at constant argon ion voltage and current, using the ion beam enhanced metal deposition method of the invention. Graph 112 illustrates that given a constant argon ion voltage of 200 V and a constant 100 milli-amps current, increasing the temperature of substrate 30 from 250 to 350° C. decreases the residual film stress from a very high tensile stress on the order of 1200 MPa down to essentially zero. Thus, the method of the invention reduces or essentially eliminates film stress in iridium metallization layer 38. Additionally, as shown in graph 114, the sheet resistance of metallization film 38 decreases with increasing substrate temperature during metal deposition. The method of the invention provides a desirable decrease in the sheet resistance of metallization film 38 from about 0.34 to about 0.23 ohm/square.

Thus, FIGS. 6 and 7 graphically demonstrate that both the sign and the magnitude of residual stresses in chromium/iridium thin metallization films are controlled using the method of the invention by controlling the substrate temperature and/or the voltage of an ion beam formed using an inert gas having energies in the range 10–2000 eV, such as argon (Ar) or krypton (Kr). Additionally, the invention has been practiced to demonstrate that the method of the invention using concurrent argon ion beam bombardment deposits much thicker iridium films of at least 6000 Angstroms without delamination, compared to the maximum non-delaminating thickness of about 4500–5200 Angstroms without ion beam bombardment under essentially the same conditions. The magnitude and sign of the residual stress in these thicker chromium/iridium films is controlled in similar fashion as in the thinner films described above. The sheet resistance of such 6000 Angstroms thick iridium films measured 0.16 ohm/square when deposited using a deposition temperature of 380° C.

Figure 8:
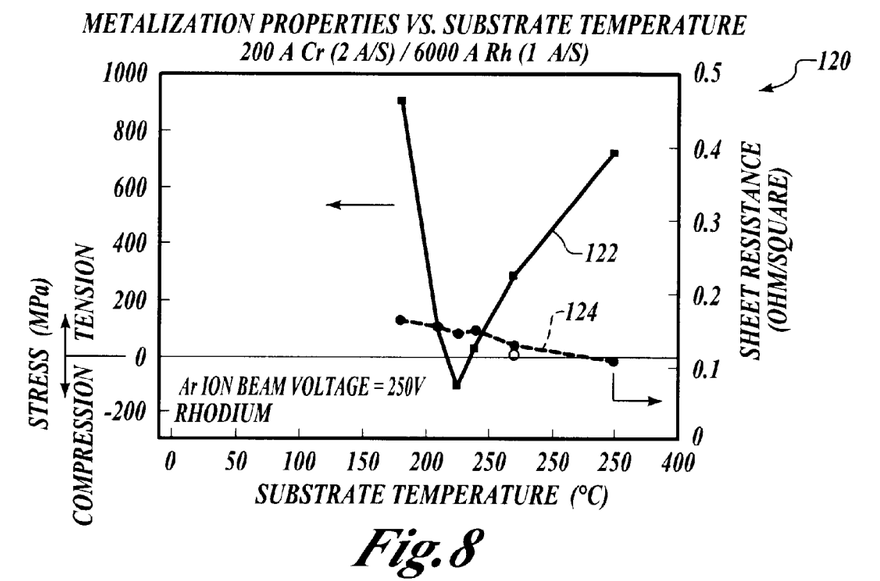
FIG. 8 is a graphical illustration of residual stress and sheet resistance of chromium/rhodium films versus substrate temperature, at constant argon ion voltage of 250 V and argon ion current of 100 milli-amps, in ion beam enhanced metal deposition.
Figure 9:
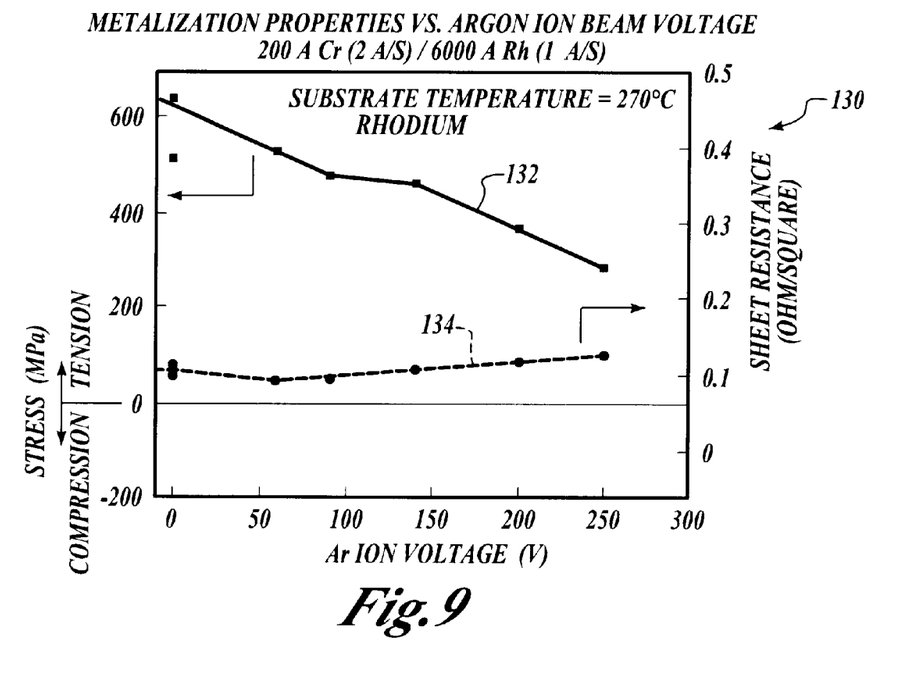
FIG. 9 is a graphical illustration of residual stress and sheet resistance of chromium/rhodium films versus argon ion voltage, at a constant deposition temperature of 270° C., and at constant argon ion current of 100 milli-amps, in ion beam enhanced metal deposition.

FIGS. 8 and 9 graphically show the results from similar experiments for chromium/rhodium thin films according to the ion beam enhanced metal deposition method of the invention wherein during deposition, the metal film is bombarded with an ion beam formed using an inert gas having energies in the range 10–2000 eV, such as argon (Ar) or krypton (Kr) or another suitable ion precursor material, such as those described above. FIG. 8 shows a graph 120 that depicts the dependence of the residual film stress and sheet resistance on the temperature of substrate 30 during deposition of chromium/rhodium thin film metallization layer 38 with concurrent constant level inert gas ion bombardment. In FIG. 8, the precursor material supplied to ion source 42 for ion bombardment during deposition is argon gas. Graph 120 illustrates residual stress and sheet resistance of chromium/rhodium thin films versus substrate temperature, at constant argon ion voltage and current, using the ion beam enhanced metal deposition method of the invention. Graph 122 illustrates that near-zero residual stress is obtained in chromium/rhodium films wherein rhodium deposition layer 38 is 6000 Angstrom thick, deposited at about 1 Angstroms/second, over a chromium adhesion layer 40, deposited at about 2 Angstroms/seconds on substrate 30. Graph 122 illustrates that, given a constant argon ion voltage of 250 V and a constant 100 milli-amps argon ion beam current, increasing the temperature of substrate 30 from about 180 to 350° C. decreases the residual film stress from a very high tensile stress on the order of 900 MPa down to zero and changes sign to compressive stress before again passing through zero and increasing to another very high tensile stress at 350° C.

Graph 122 further illustrates that relatively low or near-zero residual stress rhodium metallization films are obtained in the temperature range 210–250° C. when the argon ion beam voltage is held constant at 250 V and the argon ion beam current is held constant at 100 milli-amps. Thus, the method of the invention provides control of both the sign and the magnitude of the residual stress and reduces or essentially eliminates residual film stress in rhodium metallization layer 38, in part by controlling the temperature of substrate 30 during metal deposition. Additionally, as shown in graph 124, the sheet resistance of rhodium metallization film 38 decreases with increasing substrate temperature during metal deposition. Graph 124 also shows that sheet resistances in the range 0.14–0.16 ohm/square that are desirably useful in practical devices are obtained by the method of the invention for 6000 Angstrom thick rhodium films at least when practiced in the aforementioned temperature range.

Thus, FIG. 8 graphically demonstrates that sign and magnitude of residual stresses in chromium/rhodium thin metallization films are controlled using the method of the invention by controlling the substrate temperature during metal film deposition.

FIG. 9 is a graphical illustration of residual stress and sheet resistance of chromium/rhodium films versus ion voltage at constant argon ion current of 100 milli-amps, and constant substrate temperature of 270° C., according to the ion beam enhanced metal deposition invention. FIG. 9 shows a graph 130 that details the residual stress and sheet resistance of chromium/rhodium thin films, measured at room temperature, versus ion voltage, at constant ion current, in ion beam enhanced metal deposition. In FIG. 9, the ion beam precursor material supplied to ion source 42 for ion bombardment during deposition is argon gas. The thickness of chromium adhesion layer 40 on substrate 30 is 200 Angstroms deposited at about 2 Angstroms/second, and the thickness of rhodium metallization layer 38 is 6000 Angstroms, deposited at about 1 Angstroms/second. The temperature of substrate 30 was held constant at about 270° C. during deposition. The argon ion beam current was held constant at 100 milli-amps. The graph 132 of residual stress versus argon ion beam voltage clearly shows that as voltage increases from 0 to 250 V, which corresponds to Ar+ ion energy of 0 to 250 eV; the magnitude of the residual tensile stress in chromium/rhodium films 40/38 deposited at a constant substrate temperature of about 270° C. decreases significantly with increasing argon ion beam voltage in the range 0 to 250 V, with a constant ion beam current of 100 milli-amps. Thus, the magnitude of the residual tensile stress is controlled by means of the voltage or energy of the argon ion beam, all other parameters being constant. As shown in graph 134, the sheet resistance of the iridium films is relatively independent of ion beam voltage. The sheet resistance is a minimum at about 60 V ion beam voltage, but increases only slightly with increasing ion beam voltage. At 250 V ion beam voltage the sheet resistance is still less than 0.14 ohm/square, which is a very usable value in a practical device. Therefore, the magnitude of the residual stress is controllable by the voltage of the ion beam, which is produced from argon gas in graphs 132 and 134.

Thus, FIG. 9 graphically demonstrates that the magnitude of residual stresses in chromium/rhodium thin metallization films is controlled using the method of the invention by controlling the voltage of an ion beam formed using an inert gas having energies in the range 10–2000 eV, such as argon (Ar) or krypton (Kr). Additionally, the described practice of the invention demonstrates that the method of the invention using concurrent argon ion beam bombardment deposits much thicker iridium films of at least 6000 Angstroms without delamination, compared to the maximum non-delaminating iridium thickness of about 4500–5200 Angstroms without ion beam bombardment under essentially the same conditions. The sheet resistance of such 6000 Angstroms thick rhodium films in a desirably useful range for practical devices are obtained by the method of the invention at least when practiced in the aforementioned temperature range.

In all the examples recited above, both the metal film adhesion and the uniform, mirror visual appearance of the films was not measurably degraded compared to the adhesion and appearance in metallization films formed using similar deposition techniques, except without the concurrent ion bombardment of the invention. Furthermore, using the method of the present invention, metal films are obtained having a desirable predetermined combination of essentially zero residual stress and usefully low sheet resistance wherein the inert gas ions used for bombardment during metal deposition do not predominantly remain in the metal film and thus do not act as an electrically active impurity. The improved synthesis process of the invention is thus thought to proceed by desirably changing the microstructure of the metal film as it is being deposited, compared with the microstructure which is obtained absent the ion bombardment. However, such desirably changed microstructure of the metal film is not any part of the present invention, and the present invention is not intended to be limited to metal films having such desirably changed microstructure.

The above examples are not intended to be limiting in any way. For example, both the stress and the sheet resistance can be controlled by controlling the ion beam current, with holding constant the other parameters, such as the substrate temperature, ion beam voltage, and metal deposition rate. Ions other than argon can be used, for example, helium, neon, krypton, xenon (Xe), nitrogen (N2), and others. Those of ordinary skill in the art may, without undue experimentation, vary multiple ones of the above parameters while practicing the invention and optimizing the parameters to obtain the desired film properties. According to the invention, inert refractory pure metals and alloys other than iridium and rhodium are deposited in similar fashion as described above, thereby similarly controlling residual stress and sheet resistance. Although the invention is generally described in terms of stiff, inert, highly electrically conducting metals, other classes of metals and non-metallic materials are similarly synthesized and their properties are similarly controlled using the method of the invention. Materials other than pure elements, for example, alloys or compounds such as oxides, nitrides, carbides, borides and other suitable materials, can similarly be synthesized in the substoichiometric and fully stoichiometric chemical compositions using similar approaches. For example, a flow of a second gaseous species is simultaneously introduced to the ion beam bombardment of the growing film. The second species is, for example, a carbonaceous gas such as methane for forming a carbide film. Bombardment of the material being deposited according to the invention is also accomplished using a chemically reactive ion beam, which is derived, for example, from methane or other gas, rather than the inert gases recited above.

While the preferred embodiment of the invention has been illustrated and described, it will be appreciated that various changes can be made therein without departing from the spirit and scope of the invention. For example, although the invention was reduced to practice using positive argon ions for bombarding the metallization films, those of ordinary skill in the art will recognize that the kinetic energy of the particles impinging the material during deposition is the effective element in lowering the residual stress in thin-film metallization layers, rather than the state of charge or nature of the particles. Thus, the invention contemplates bombarding the metallization with different particles of an inert gas, including either negatively or positively charged ions or neutral atoms or molecules.

What is claimed is:

1. A method of forming an electro-mechanical device comprising:
    providing a structure having a movable portion and a support portion connected therewith; and
    forming a layer of electrically conductive material over said structure and positioned to carry electrical current, said layer being formed over at least some of said movable portion and some of said support portion, said layer comprising an inert material having a Young's modulus at room temperature which is greater than that of elemental gold at room temperature and a predetermined residual stress less than 300 MPa.

2. The method of claim 1, wherein said predetermined residual stress is near zero.

3. The method of claim 1, wherein said providing said structure further comprises forming said structure from a crystalline material.

4. The method of claim 1, wherein said providing said structure further comprises etching said movable portion and said support portion from a crystalline material.

5. The method of claim 1, wherein said forming of said layer of electrically conductive material further comprises physically vapor depositing said layer of material.

6. The method of claim 1, wherein said providing said structure further comprises forming said structure from a crystalline material, and wherein the forming of said layer of electrically conductive material further comprises physically vapor depositing said layer of material.

7. The method of claim 1, wherein said forming of said layer of electrically conductive material further comprises physically vapor depositing one of iridium, rhodium, osmium, tungsten, and alloys of iridium, rhodium, osmium, and tungsten over the structure.

* * * * *